United States Patent [19]

Ho

[11] Patent Number: 5,629,901
[45] Date of Patent: May 13, 1997

[54] MULTI WRITE PORT REGISTER

[75] Inventor: Stanley T. Ho, Chittenden County, Vt.

[73] Assignee: International Business Machines Corporation, Armonk, N.Y.

[21] Appl. No.: 567,607

[22] Filed: Dec. 5, 1995

[51] Int. Cl.[6] .................................. G11C 7/00; G11C 8/00
[52] U.S. Cl. .......................... 365/230.05; 365/230.08; 365/189.05; 365/189.08; 365/194
[58] Field of Search ..................... 365/189.04, 189.05, 365/189.08, 194, 230.05, 230.08

[56] References Cited

U.S. PATENT DOCUMENTS

| 5,212,665 | 5/1993 | Ihara | 365/230.02 |
| 5,247,484 | 9/1993 | Watanabe | 365/230.05 |
| 5,260,908 | 11/1993 | Ueno | 365/230.05 |
| 5,285,413 | 2/1994 | Miyauchi et al. | 365/189.04 |
| 5,287,323 | 2/1994 | Takahashi et al. | 365/230.05 |
| 5,289,427 | 2/1994 | Nicholes et al. | 365/230.05 |
| 5,355,335 | 10/1994 | Katsuno | 365/189.04 |
| 5,377,157 | 12/1994 | Matsumoto et al. | 365/230.05 |
| 5,384,734 | 1/1995 | Tsujihashi et al. | 365/189.04 |
| 5,481,495 | 1/1996 | Henkel et al. | 365/230.05 |

Primary Examiner—David C. Nelms
Assistant Examiner—Trong Quang Phan
Attorney, Agent, or Firm—Whitham, Curtis, Whitham & McGinn; Susan M. Murray

[57] ABSTRACT

A multi-write port register is provided with a local clock buffer (LCB) to control a gate on the input port to reduce potential timing hazards. The LCB provides flexible logic function and is controlled by a clock and word-line inputs. In addition, the LCB may also have bit-line and/or field mask inputs. The LCB handles all the timing critical functions that all the Word Lines (WLs) previously performed in conventional multi-write port registers, thus providing a substantial performance increase.

9 Claims, 11 Drawing Sheets

MULTI WRITE PORT REGISTER

BACKGROUND OF THE INVENTION

1. Field of the Invention

The present invention generally relates to multi-write port registers and, more particularly, to a multi-write port register with a local clock buffer (LCB) having a logic function controlling the register's write-enable input port and handling all the critical timing functions of the register.

2. Background Description

The design of multi-write port registers becomes increasingly complex and difficult as the number of simultaneous write ports required for the design increases. The design is further complicated by requirements for maskable fields or the need for set/reset/sticky-write ports implemented in the registers. A "sticky-write" of a register is a write operation that is dependent on the contents of the data being written to the register. For example, in a sticky-1 write operation, only a "1" can be written. A "0" attempted write will be repressed.

In a typical register design, Write-port Data is sent to the Write-port Bit Lines (BLs) during the CLKC cycle of the clock signal, and the register cells to be written will have a Write Enable (WE) signal applied to the cells during the following CLKT cycle. The register will be continually written with data coming from its Write-port BLs as long as the WE signal is asserted. Consequently, the WE signal must be deasserted at or before the next CLKC signal is asserted because the next set of Write-port Data is being sent to the BLs during this cycle. If the WE signal is not deasserted in time, there is a risk of unintentionally writing the new write data into the registers.

SUMMARY OF THE INVENTION

It is therefore an object of the present invention to provide a multi-write port register which avoids the timing hazard resulting in over-writing good data with data from the following cycle/state.

According to the invention, there is provided a multi-write port register with a local clock buffer (LCB) controlling a pass-gate on the signal's WE input port to reduce potential timing hazards. The LCB provides flexible logic function and is controlled by a clock and word-line inputs. In addition, the LCB may also have bit-line and/or field mask inputs. The LCB handles all the timing critical functions that all the Word Lines (WLs) previously performed in conventional multi-write port registers.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS

Figure 1:
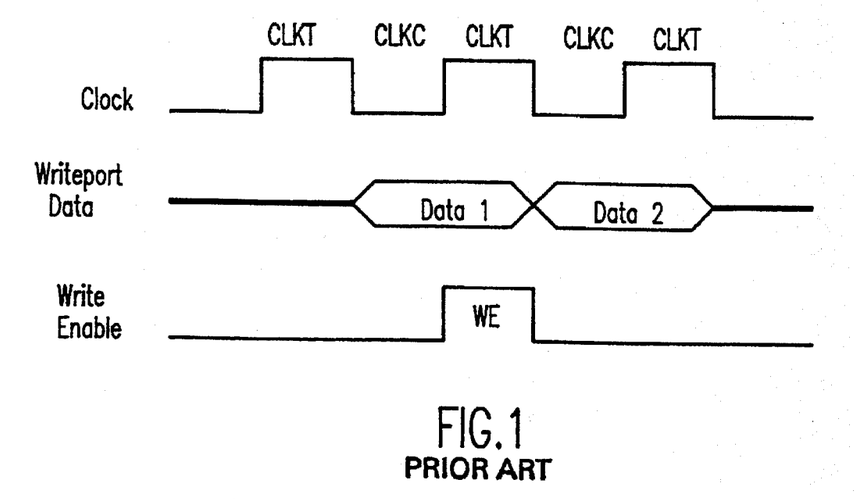
FIG. 1 is a simplified timing diagram showing the timing relationships of the clock, write port data and Write Enable (WE) signals for the prior art implementation shown in FIGS. 2 and 3.
Figure 2:
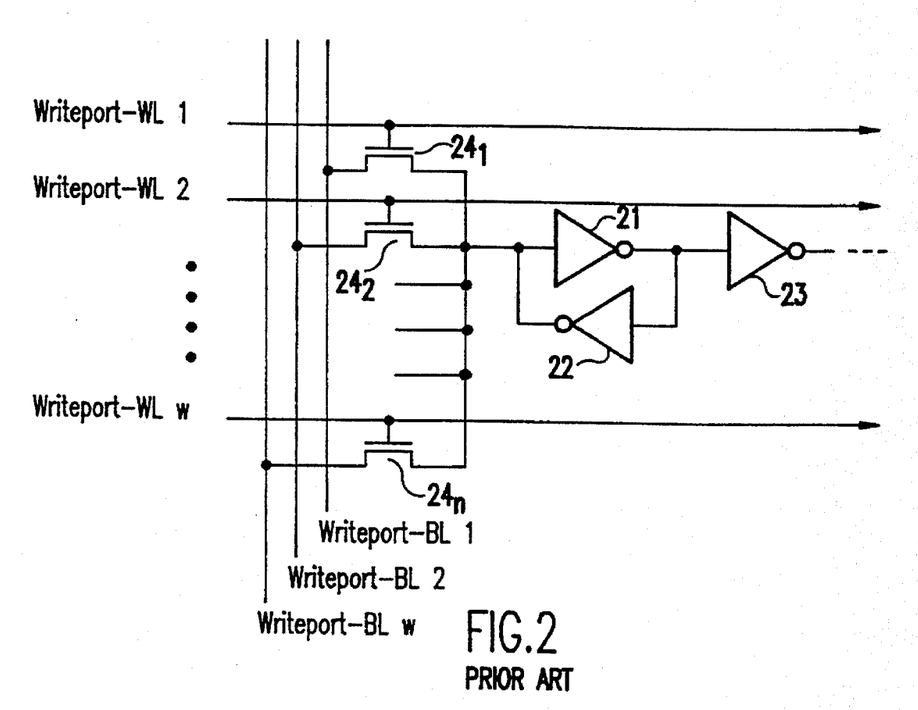
FIG. 2 is a schematic diagram of the write portion of a conventional multi-write port register cell.
Figure 3:
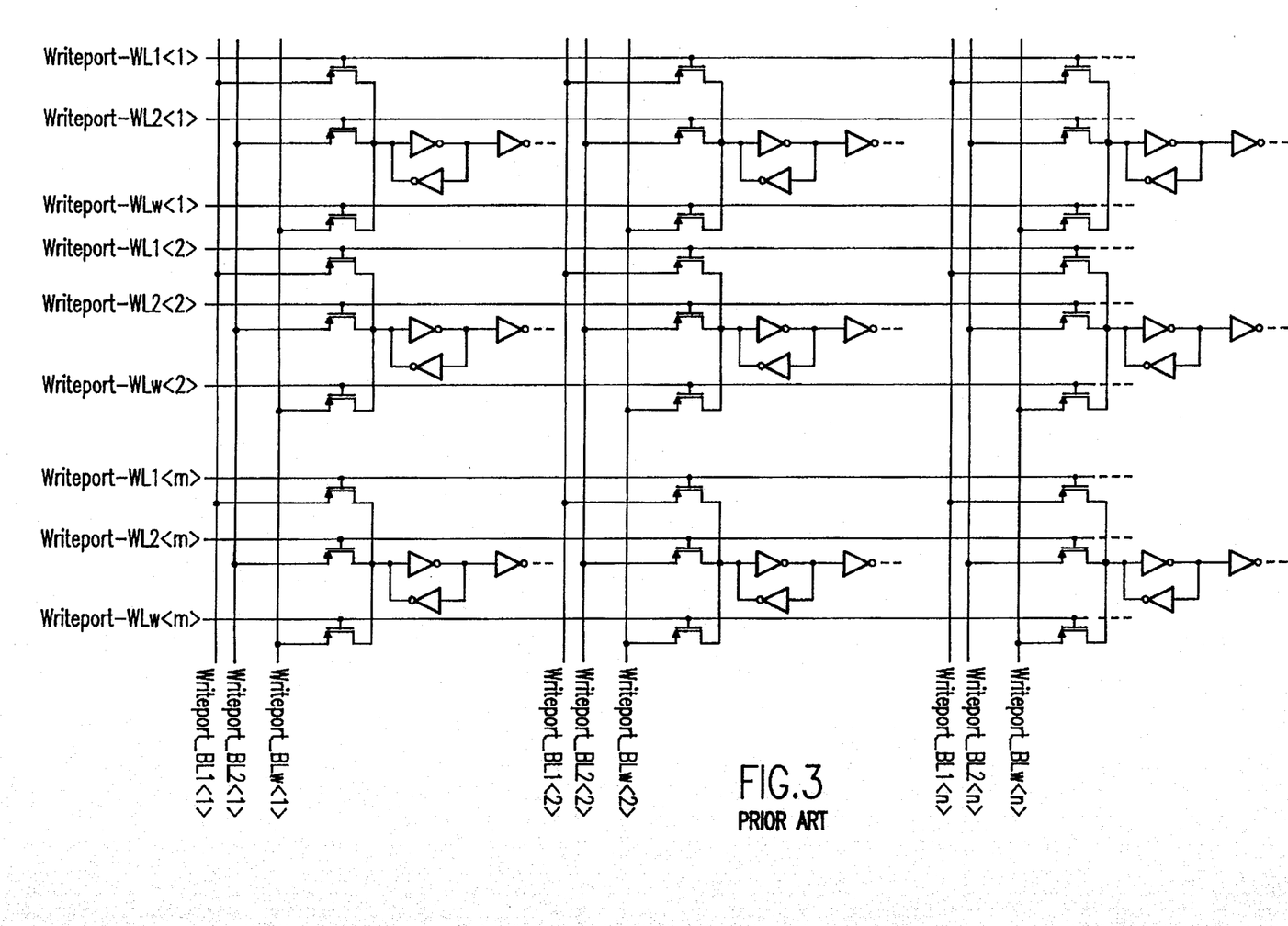
FIG. 3 is a schematic diagram showing the old multi-write port register design using the write circuit shown in FIG. 2.

Referring now to the drawings, and more particularly to FIG. 1, there is shown a timing diagram for the prior art implementation shown in FIGS. 2 and 3 which illustrates the process in which an attempt is being made to write Data 1 into one of the registers of a multi-write port register. The Clock signal is divided into alternate CLKC and CLKT clock cycles. Write-port Data is propagated to the Write-port Bit Lines (BLs) during the CLKC cycle. During the following CLKT cycle, the Write-Enable (WE) signal is asserted to write data coming from the Write-port BLs to the register cells. The edges of the WE signal are supposed to be coincident with the edges of the clock signal; however, if the trailing edge of the WE signal extends into the next CLKC cycle because of clock skew and/or propagation delay, there is the risk of accidentally writing Data 2 into the register instead.

FIG. 2 illustrates the write portion of a conventional multi-write port register cell having w simultaneous Write Ports. The cell itself is composed of cross-coupled inverters 21 and 22, forming a latch, followed by an output inverter 23, acting as a buffer. The register cell's Write-Enable (WE) input for each write port is shared by all the other register cells in the same row, if the register entry is not segmented into separate write fields. FIG. 3 shows an example of a w-write port register file consisting of m entries by n bits. If the register entry is segmented, all the cells grouped with each write field have a common Write-Enable signal input for each of their Write Ports. Each of the cell Write-Enables are referred to herein as Write-port Word Lines (WLs). Referring back to FIG. 2, each of the write port WLs 1 through w (associated with each entry) are connected to corresponding ones of the gates of field effect transistors (FETs) $24_1$ to $24_n$. Write-port Bit Lines (BLs) 1 to w are connected to corresponding ones of the sources of the FETs $24_1$ to $24_n$, and the drains of the FETs are connected in common to the input of the latch formed by cross-coupled inverters 21 and 22.

For this cell, it is important that the write port WLs are deasserted before new data appears on their corresponding Write-port BLs in order to avoid writing erroneous data into the cell. This can be done by designing the WL-driver circuitry to allow for propagation delay, clock skew, and process variations so that the WLs will be deasserted at the proper time. This can be a very time-consuming iterative process that may take up additional area and burn additional power to minimize the signal skew through the WLs.

If the register contains w simultaneous Write-ports and is divided into s disjoint Write-Fields, we will require w×s WL-Drivers. Assuming that these drivers are too large to embed within the data portion of the register, but must be placed to the side of it, w×s WL-Driver signal lines running across each register entry will be required, and this will increase the height of each cell entry in order to accommodate all of the WL-Driver signal lines within the cell.

Figure 4:
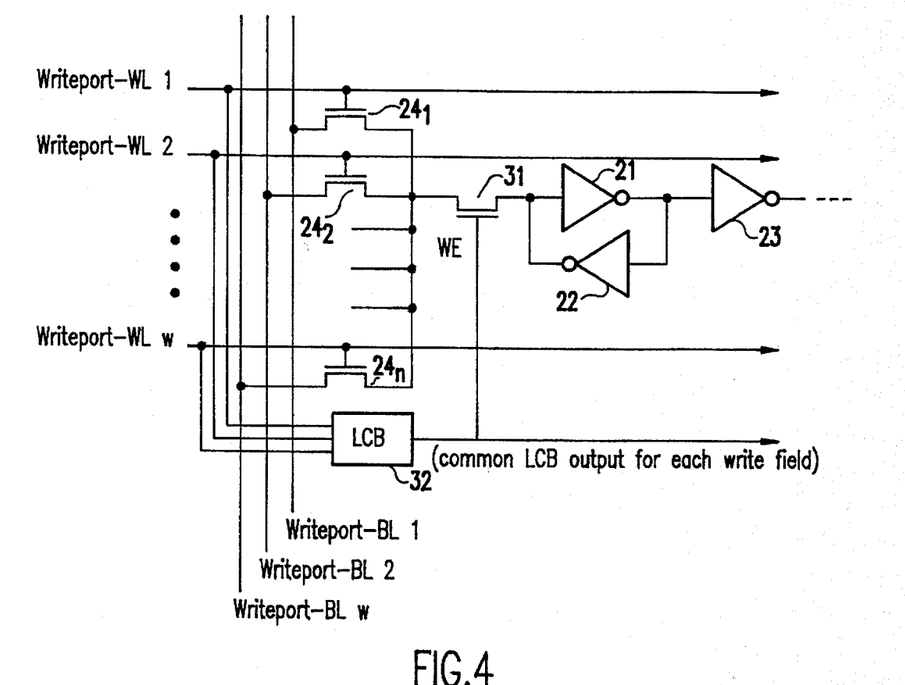
FIG. 4 is a schematic diagram of the write portion of the multi-write port register cell according to the present invention.

FIG. 4 shows a cell structure with a write-control scheme according to the present invention. In this figure, the same reference numerals as used in FIG. 2 denote the same structure. In this circuit, a new FET, 31, has been added to the cell that now functions as the singular Write-Enable gate for the cell. A new circuit, called the Local Clock Buffer (LCB) 32, now generates the singular Write-Enable signal for FET 31. This Write-Enable signal is common among all the cells that share their write port WL signals, and are contained in the same Write Field segment. That is, the LCB 32 will drive all the cells that are situated in the same row.

It should be noted that the Write-Enable signal from the LCB 32 is the only one in this cell that is time critical; e.g., it must be deasserted before the write port BLs are updated with new data. Note that in this implementation, the write port WLs do not have any strict timing requirements, as contrasted with conventional designs where all the write port WLs had strict timing requirements. The LCB now handles all the timing critical functions that all the WLs in the previously described design did.

Figure 5:
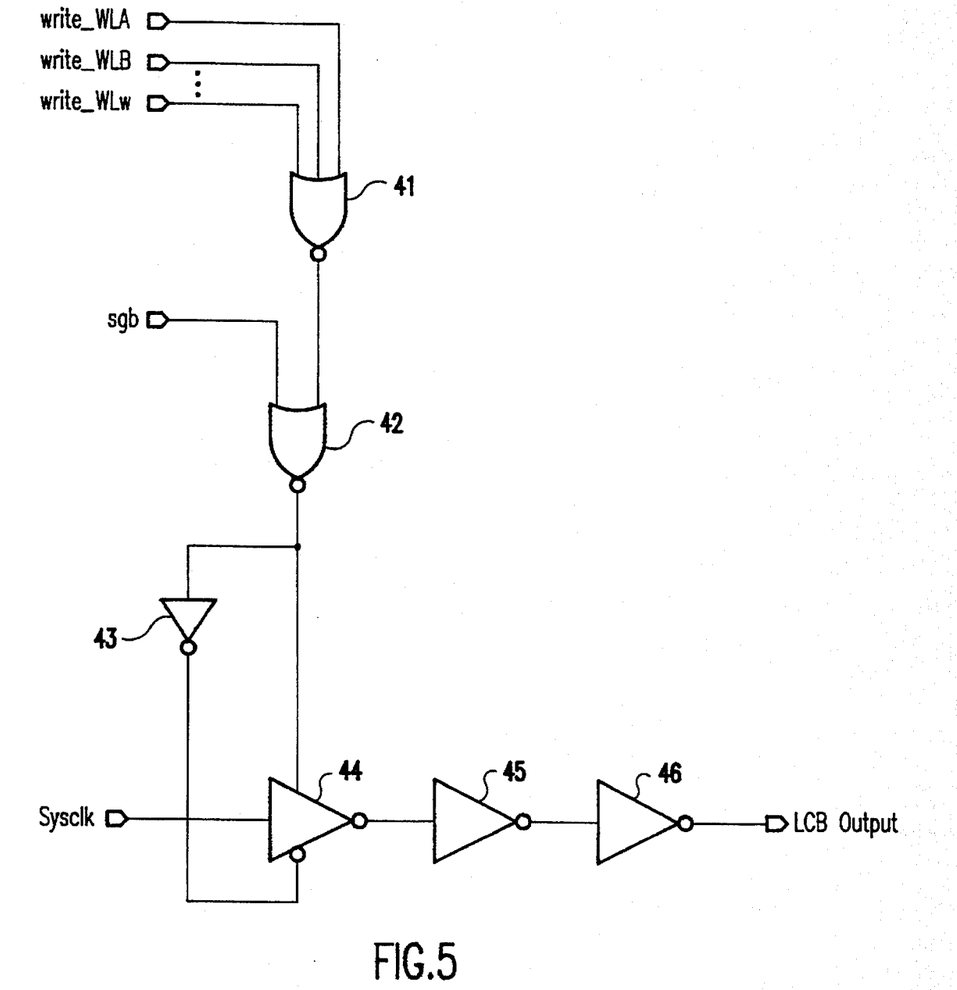
FIG. 5 is a logic diagram of a simple local clock buffer (LCB) used in the write control scheme of the invention.

FIG. 5 shows the logic of a simple LCB circuit 32 that is designed for a register that has w write ports and a global write-disable signal "sgb". The combinational logic comprising NOR gates 41 and 42 generates what is referred to herein as a qualifier or select signal. NOR gate 41 receives w Write-port WLs and generates an output to one input of NOR gate 42. The second input to NOR gate 42 is a signal which inhibits writes to the register during a scan. The output of NOR gate 42 is the select signal. This signal and its inverse, generated by inverter 43, are applied to a tri-state buffer 44 which receives as its input the system clock (sysclk) signal. The output of the tri-state buffer 44 is applied to an inverter string, here represented by inverters 45 and 46, to produce a desired delay between the sysclk signal and the LCB output. In this way, the LCB signal is "tuned" for a fixed delay between the sysclk signal and the LCB output.

Figure 6:
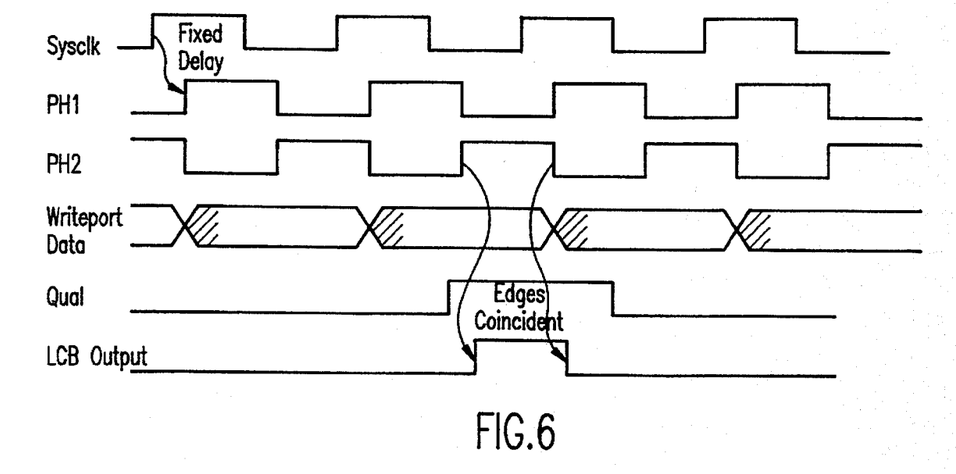
FIG. 6 is a detailed timing diagram showing the timing relationships of the system clock and the resulting LCB output.

Referring to FIG. 6, the fixed delay between the sysclk signal is shown with a timing offset between the sysclk signal and the phase one and phase two (PH1, PH2) signals. The PH1 and PH2 signals are complementary signals that rise and fall at the same time (i.e., the fixed delay from sysclk to PH1 and PH2 signals is the same for both signals). The inverse of the PH1 signal is the PH2 signal, this signal being generated by the tri-state buffer 44 if the tri-state buffer were continually enabled. The assumption here is that data is fed by a PH1 slave latch and written during a PH2 cycle, corresponding the CLKC and CLKT cycles. The qual signal output from NOR gate 42 enables the tri-state buffer 44 to propagate the delayed PH2 clock cycle for writing data, thereby avoiding overwriting data from the following data cycle. If the qual signal is deasserted, the PH2 signal is suppressed altogether.

Figure 7:
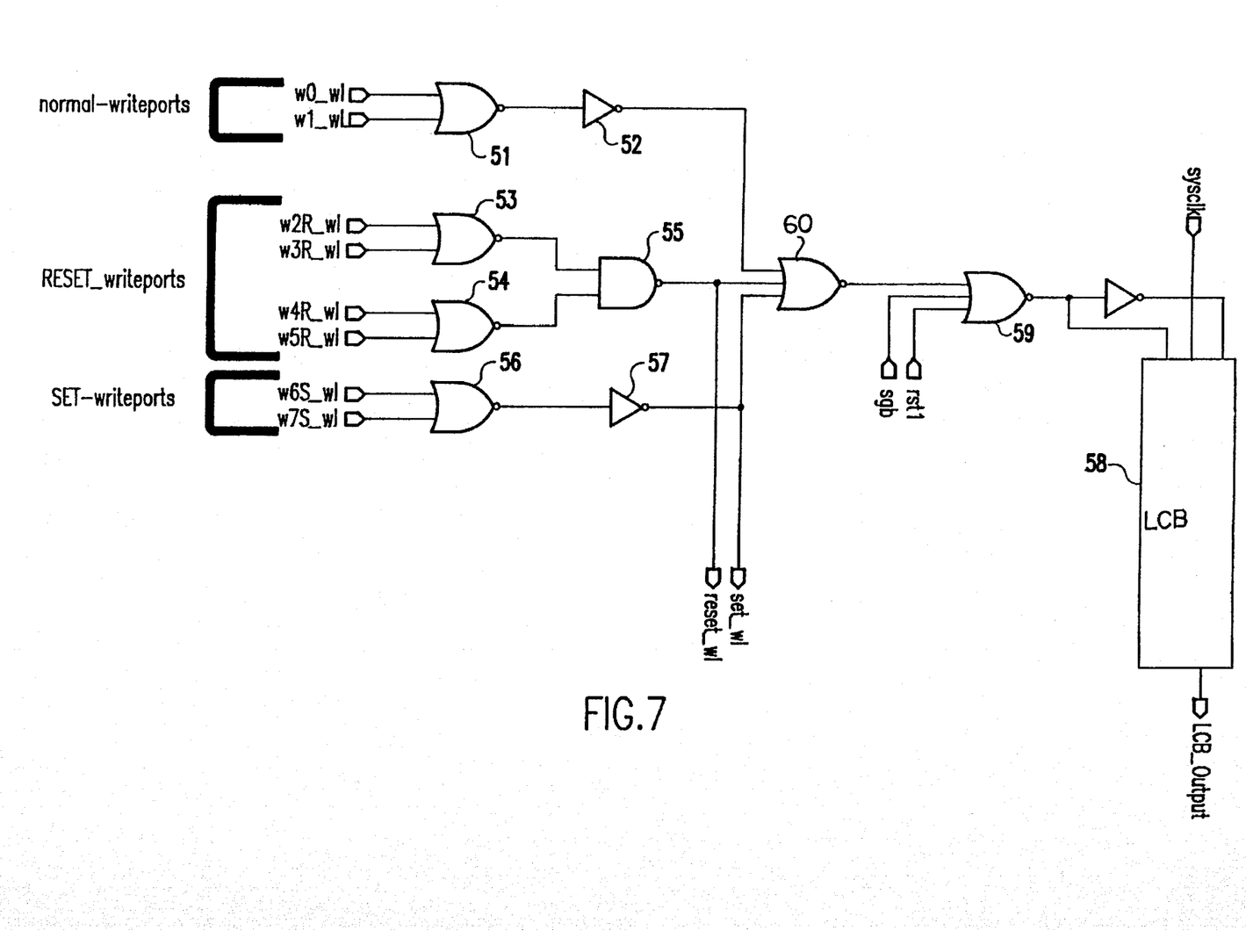
FIG. 7 is a logic diagram of an LCB which supports two conventional write ports, two reset ports and one set port.
Figure 8:
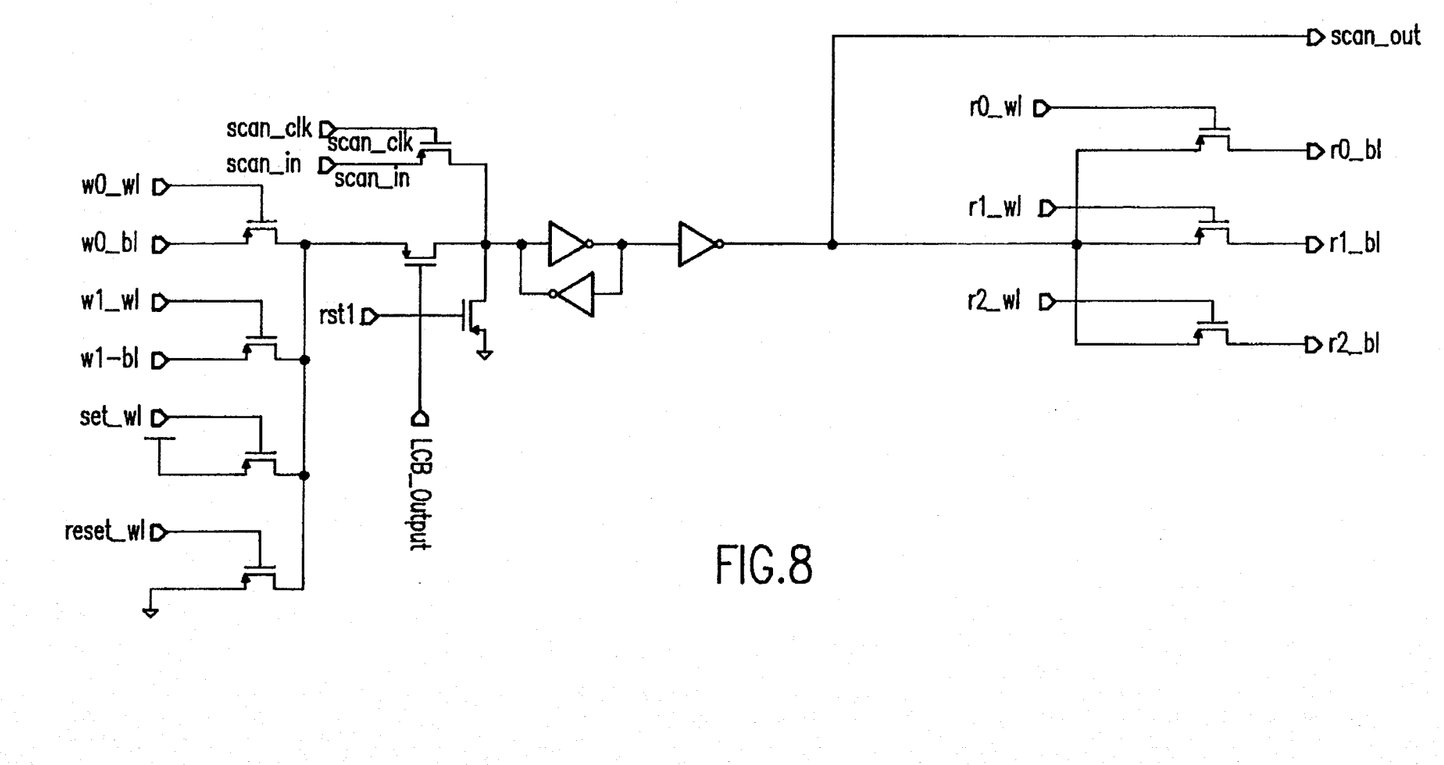
FIG. 8 is a schematic diagram of a register cell to which the LCB of FIG. 7 is connected.

FIG. 7 illustrates an LCB which has two normal writeports, four reset writeports, and two set port. An example of the register cell that receives the output of this LCB is shown in FIG. 8. In FIG. 7, NOR gate 51 and inverter 52 form an OR function for the two normal writeport wordlines, while NOR gates 53 and 54 and NAND gate 55 comprise an OR network for the reset wordlines. NOR gate 56 and inverter 57 form the final OR network for the single set wordline. The outputs of inverter 52, NAND gate 55 and inverter 57 are input to NOR gate 60. When any of these outputs is high, the output of NOR gate 60 is active "low". The reset_wl, set_wl, and LCB_Output ports in the LCB 58 are connected to the same input ports in the memory cell of FIG. 8. The inputs sgb and rst1 to NOR gate 59 are global signals that can inhibit writes from occurring and can override the write requests from the set, reset, and conventional writeports.

Figure 9:
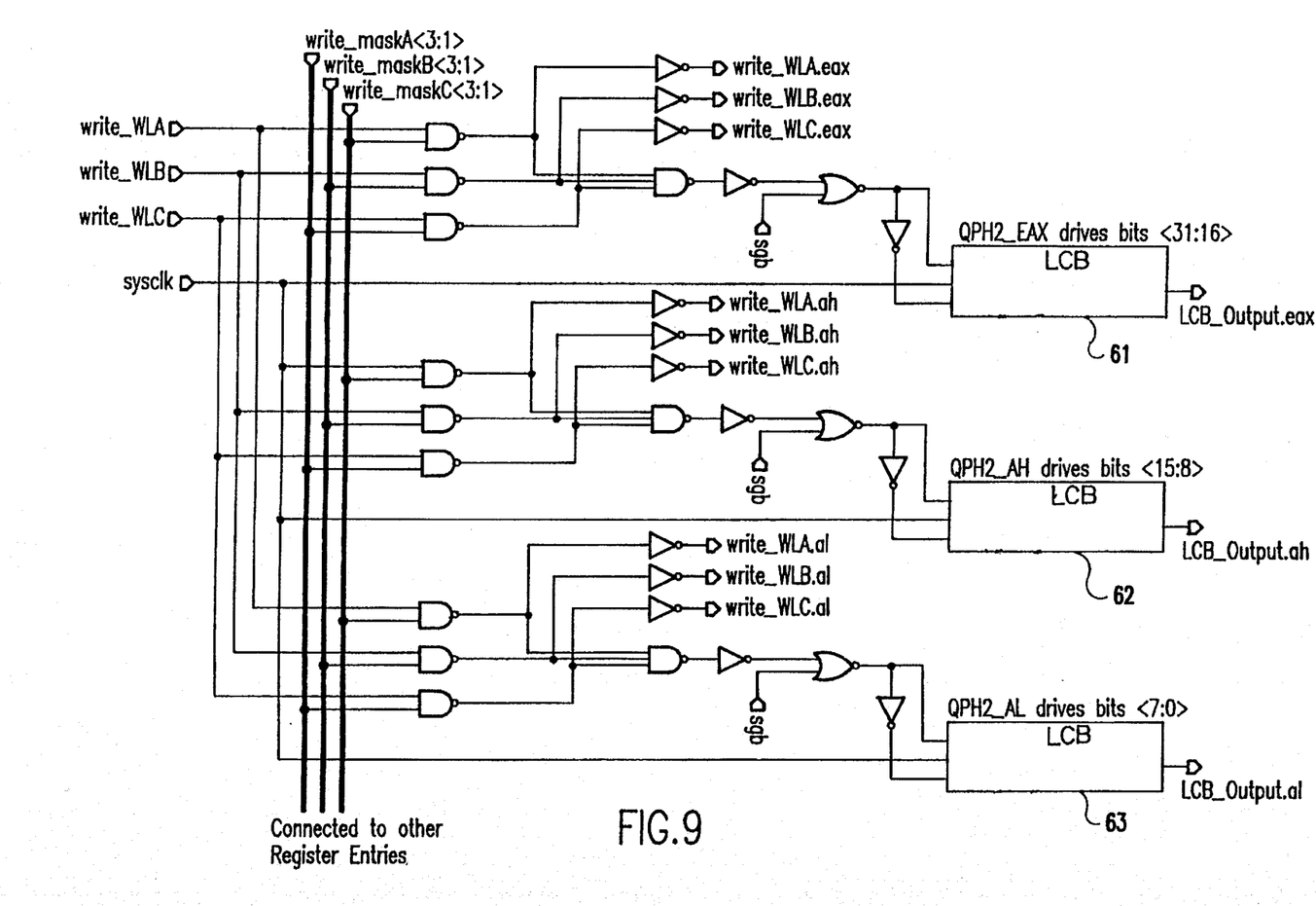
FIG. 9 is a logic diagram of an LCB for a three-writeported register file that consists of three disjoint segments.
Figure 10:
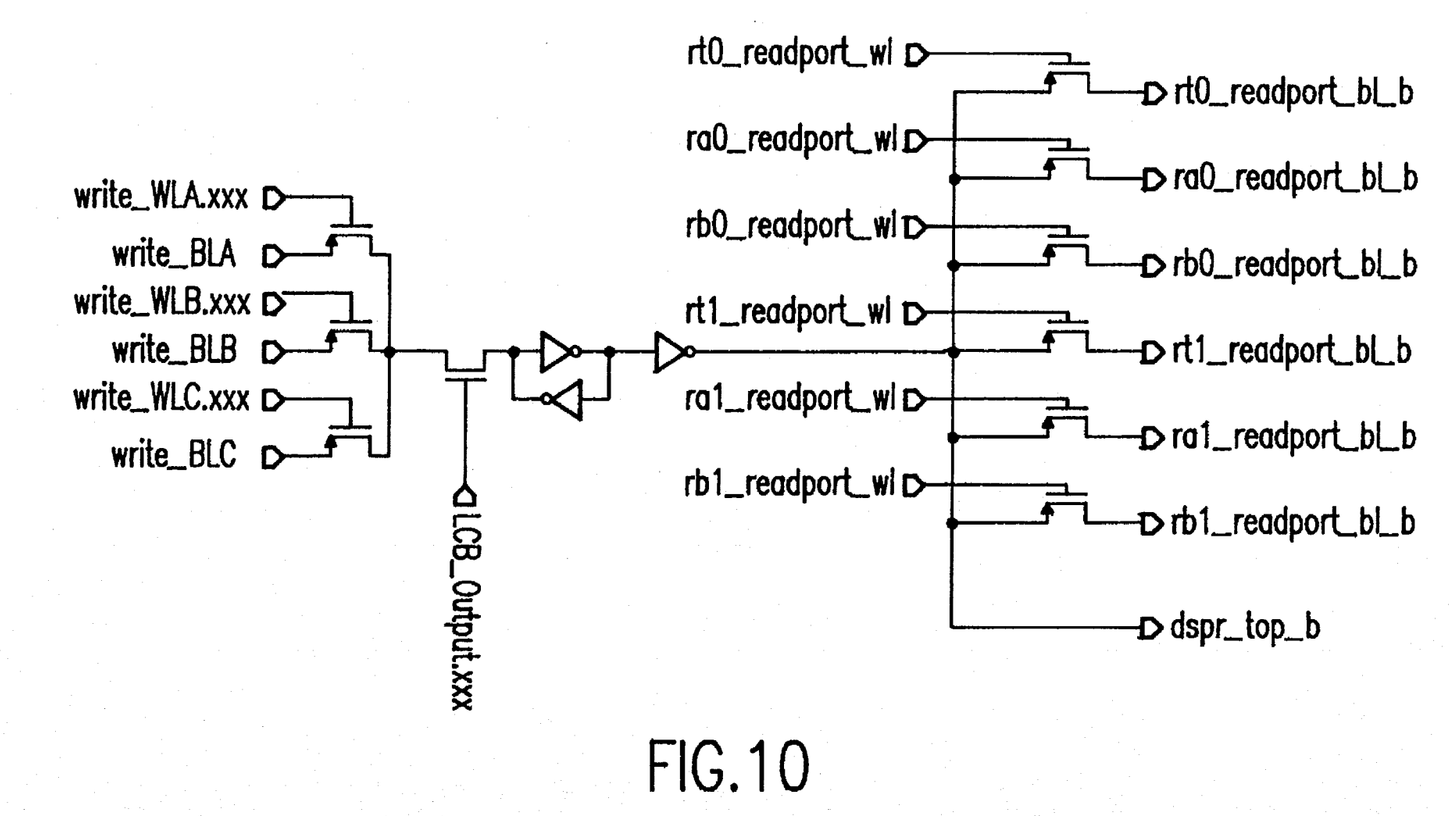
FIG. 10 is a schematic diagram of a single register cell of the register file to which the LCB of FIG. 9 is connected.

FIG. 9 illustrates an LCB for a three-writeported register file that consists of three disjoint segments: EAX, AH and AL. There are three stacks of LCBs 61, 62 and 63, each stack being associated with each of the three segment fields. There are thirty-two LCBs in each stack in this example. From a layout perspective, each LCB stack is physically located next to the register data segment (of cells) that it drives. The LCB_Output.eax port from LCB 61 drives an EAX cell segment located within that entry set of cells, LCB_Output.ah port from LCB 62 drives the AH segment of cells, and the LCB_Output.al port from LCB 63 drives the AL segment. For this example, this schematic is replicated thirty_two times, to match up with the thirty-two entries in the register file. An example of a register file cell for one of the segments is shown in FIG. 10.

In the implementation of the LCB shown in FIG. 9, each of the three writeports has a segment mask signal associated with it. Writeport A is masked by write_maskA<3:1>, writeport B's segments are masked by write_maskB<3:1>, and writeport C is masked by write_maskC<3:1>. If write_maskA<3> is active, the EAX segment can potentially be written by writeport A. write_maskA<2> controls the AH segment, and write_maskA<1> controls the AL segment. Note that the write_WLA.eax, write_WLB.eax, and WLC.eax outputs are attached to the write_WLA.xxx, write_WLB.xxx and write_WLC.xxx inputs in the cell schematic of FIG. 10. All of the cells that are in a data segment share these three ports. The .ah LCB outputs are attached to the AH cell segment, and the .al LCB outputs are connected to the AL cell segment.

Figure 11:
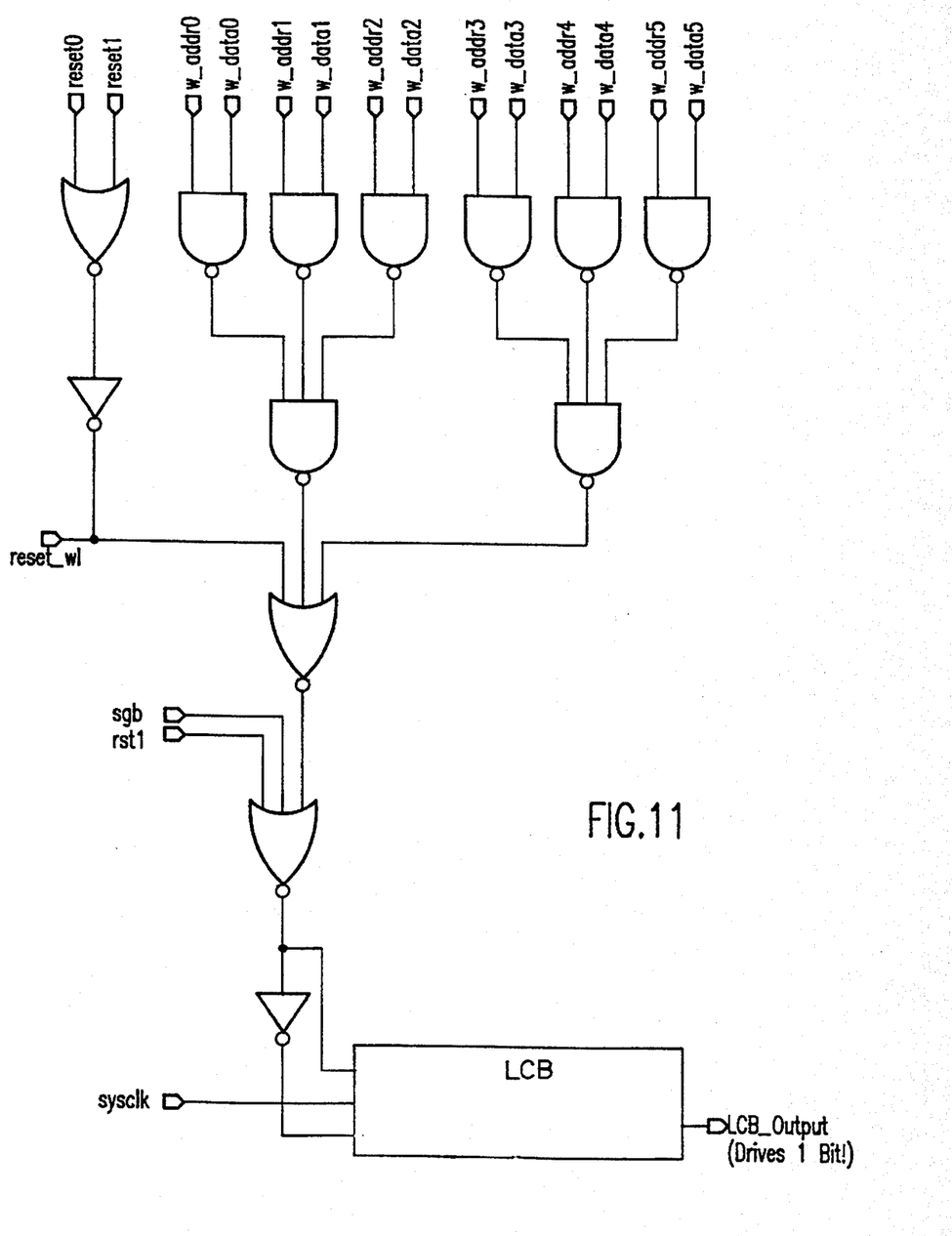
FIG. 11 is a logic diagram of an LCB that implements two reset writeports and six sticky-1 writeports.
Figure 12:
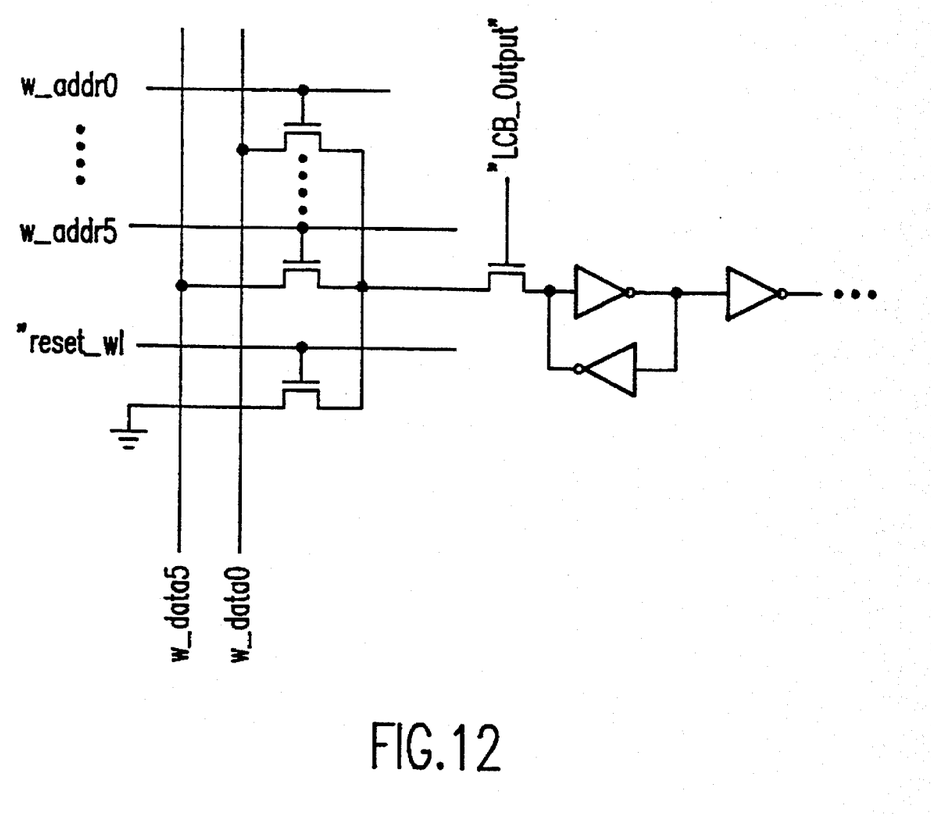
FIG. 12 is a schematic diagram of a single register cell of the register file to which the LCB of FIG. 11 is connected.

FIG. 11 shows an example of an LCB that implements two reset writeports and six sticky-1 writeports. FIG. 12 shows the schematic of a register cell for this LCB. Each of the six sticky-1 writeports have a write-wordline (WL) and a bitline (BL) associated with it. If a write operation occurs, the write-WL is made active, and the write-data is placed on the write-BL. For the sticky-1 operation, a "1" will be written into the cell if the data on the write-BL is a "1"; however, if the write-BL data is a "0", the write operation will be suppressed and the cell will retain its previous data state.

Figure 13:
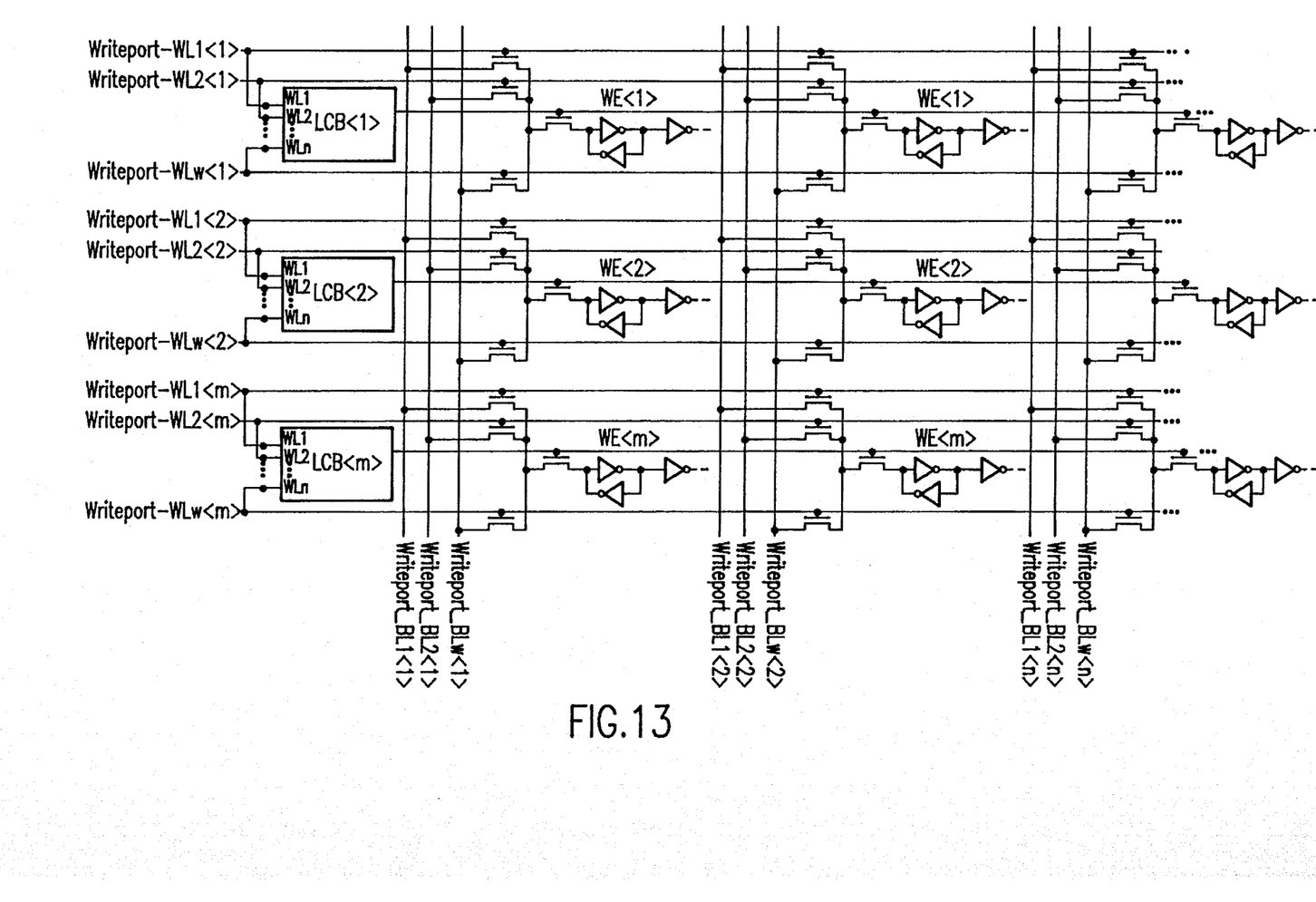
FIG. 13 is a schematic diagram illustrating a w-write-port, m-entry register file (n-bit) according to a preferred embodiment of the invention.

FIG. 13 illustrates the invention by way of example in an w write port, m-entry register file with n bits. Each entry consists of a single segment.

If the LCBs can be imbedded within the data portion, it is possible to run only the w write port WLs plus one additional wire for each LCB output for its corresponding Write-Field. If the LCBs are located in close proximity to their attached cells, they will not require as much power to drive their outputs, or as much area. For w write fields and m entries, w×m LCBs are required in total for each register segment.

While the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. A multi-write port register file comprising:

a plurality of gates connected between multiple write ports and a corresponding plurality of cells of the multi-write port register file; and a plurality of local clock buffers connected to control selected ones of said gates, the number of said local clock buffers corresponding to a number of write fields for the multi-write port register, each local clock buffer generating a write-enable signal to corresponding selected ones of said gates which write-enable signal is common among all cells contained in the same write field, said local clock buffer incorporating a fixed time delay between a system clock and an output of the local clock buffer to reduce timing hazards in writing data to the register in succeeding data cycles.

2. The multi-write port register file recited in claim 1 wherein write ports for a cell of the register comprise a plurality of write-port bit lines and a plurality of write-port word lines, each of said write-port bit lines being connected to a source of a corresponding field effect transistor and each of said write-port word lines being connected to a gate of a corresponding field effect transistor, drains of said field effect transistors being connected in common to one of said gates for that cell.

3. The multi-write port register file recited in claim 2 wherein the local clock buffer comprises:

combinatorial logic for generating a write select signal;

a tri-state buffer controlled by said write select signal to pass one phase of a system clock; and delay means connected to the output of said tri-state buffer for delaying the system clock passed by the tri-state buffer, the output of the delay means being connected to said gate.

4. The multi-write port register file recited in claim 3 wherein the combinatorial logic receives a plurality of write-port write lines as inputs and generates said write select signal as a logical sum of signals on the write-port write lines.

5. The multi-write port register file recited in claim 3 wherein the local clock buffer is connected to a plurality of normal write-ports, a plurality of reset write-ports and at least one set write-port.

6. The multi-write port register file recited in claim 5 wherein said combinatorial logic receives as inputs signals from said normal write-ports, said reset write-ports and said set write-port and generates said write select signal as a logical sum of said signals.

7. The multi-write port register file recited in claim 3 wherein said local clock buffer is connected to a multi-writeported register file consisting of multiple disjoint segment fields, there being multiple stacks of local clock buffers each associated with one of the segment fields.

8. The multi-write port register file recited in claim 7 further comprising a segment mask signal associated with each of the multiple write ports.

9. The multi-write port register file recited in claim 3 wherein said local clock buffer is connected to a register file with a plurality of sticky-1 write-ports, each sticky-1 write-port having a write-wordline and a bitline associated with it, wherein for a sticky-1 operation, a "1" will be written into a cell of the register file if data on the bitline is "1", but if the bitline is a "0", the write operation is suppressed and the cell will retain its previous data state.

* * * * *